United States Patent
Pih

(10) Patent No.: US 6,177,805 B1
(45) Date of Patent: Jan. 23, 2001

(54) HIGH DENSITY TEST CONNECTOR FOR DISK DRIVES IN A HIGH VOLUME MANUFACTURING ENVIRONMENT

(75) Inventor: David Pih, Milpitas, CA (US)

(73) Assignee: International Business Machines Corporation, Armonk, NY (US)

( * ) Notice: Under 35 U.S.C. 154(b), the term of this patent shall be extended for 0 days.

(21) Appl. No.: 09/200,278

(22) Filed: Nov. 24, 1998

(51) Int. Cl.[7] .............................. G01R 31/02; H01R 12/00
(52) U.S. Cl. ................................................. 324/754; 439/74
(58) Field of Search ..................................... 327/754, 757, 327/758, 761, 765, 538; 439/60, 59, 74, 61, 62, 65, 260, 267, 632, 71; 360/31, 108

(56) References Cited

U.S. PATENT DOCUMENTS

| | | | |
|---|---|---|---|
| 3,911,361 | * 10/1975 | Bove et al. | 324/761 |
| 4,967,155 | * 10/1990 | Magnuson | 324/212 |
| 5,285,948 | * 2/1994 | Rupp et al. | 228/104 |
| 5,473,254 | * 12/1995 | Asar | 324/537 |
| 5,795,172 | * 8/1998 | Shahriari et al. | 439/260 |
| 5,896,037 | * 4/1999 | Kudla et al. | 324/755 |

* cited by examiner

Primary Examiner—Safet Metjahic
Assistant Examiner—Anjan K Deb
(74) Attorney, Agent, or Firm—Noreen A. Krall; Robert B. Martin

(57) ABSTRACT

A test connector for making electrical tests on a disk drive on a high volume manufacturing line. The test connector comprises a high density connector header for electrical connection to a disk drive electrical connector fixed to a printed circuit board (PCB) card having well-separated, large area contact pads electrically connected to the contacts on the connector header. The well-separated, large area contact pads on the test connector provide contact points for test probes from automated testers on the manufacturing line. Use of the test connector with its well-separated, large area contacts increases the reliability of electrical testing procedures with automated testers by reducing accidental shorting between test probes and by increasing contact alignment tolerances.

6 Claims, 5 Drawing Sheets

HIGH DENSITY TEST CONNECTOR FOR DISK DRIVES IN A HIGH VOLUME MANUFACTURING ENVIRONMENT

BACKGROUND OF THE INVENTION

1. Field of the Invention

This invention relates in general to disk drives, and in particular to a connector for testing disk drives in a high volume manufacturing environment and a method of using the same.

2. Description of Related Art

Moving magnetic storage devices, especially magnetic disk drives, are the memory devices of choice. This is due to their expanded non-volatile memory storage capability combined with a relatively low cost.

Magnetic disk drives are information storage devices which utilize at least one rotatable magnetic media disk having concentric data tracks defined for storing data, a magnetic recording head or transducer for reading data from and/or writing data to the various data tracks, a slider for supporting the transducer in proximity to the data tracks typically in a flying mode above the storage media, a suspension assembly for resiliently supporting the slider and the transducer over the data tracks, and a positioning actuator coupled to the transducer/slider/suspension combination for moving the transducer across the media to the desired data track and maintaining the transducer over the data track center line during a read or a write operation. The transducer is attached to or is formed integrally with the slider which supports the transducer above the data surface of the storage disk by a cushion of air, referred to as an air-bearing, generated by the rotating disk.

Alternatively, the transducer may operate in contact with the surface of the disk. Thus, the suspension provides desired slider loading and dimensional stability between the slider and an actuator arm which couples the transducer/slider/suspension assembly to the actuator. The actuator positions the transducer over the correct track according to the data desired on a read operation or to the correct track for placement of the data during a write operation. The actuator is controlled to position the transducer over the desired data track by shifting the combination assembly across the surface of the disk in a direction generally transverse to the data tracks. The actuator may include a single arm extending from a pivot point, or alternatively a plurality of arms arranged in a comb-like fashion extending from a pivot point. A rotary voice coil motor (vcm) is attached to the rear portion of the actuator arm or arms to power movement of the actuator over the disks.

The vcm located at the rear portion of the actuator arm is comprised of a top plate spaced above a bottom plate with a magnet or pair of magnets therebetween. The vcm further includes an electrically conductive coil disposed within the rearward extension of the actuator arm and between the top and bottom plates, while overlying the magnet in a plane parallel to the magnet. In operation, current passes through the coil and interacts with the magnetic field of the magnet so as to rotate the actuator arm around its pivot and thus positioning the transducer as desired.

The magnetic media disk or disks in the disk drive are mounted to a spindle. The spindle is attached to a spindle motor which rotates the spindle and the disks to provide read/write access to the various portions on the concentric tracks on the disks.

One or more electrical conductors extend over the suspension assembly to electrically connect the read/write transducer to a read/write chip on the actuator arm. A multiline flexible printed circuit cable (actuator flex cable) provides the electrical contact between the read/write chip and the disk drive electronics which are mounted outside the disk drive housing. Inside the disk drive housing, the actuator flex cable connects to an electrical connector pin assembly, which in turn, through an opening or connector port in the housing, connects to the external electronics.

The trend in magnetic disk drive development is towar higher data storage density in smaller, more compact packages. As components become smaller, much smaller connectors must be used to provide electrical connections to the disk drive from the external electronics. These small connectors have a large number of contacts and therefore very small pitch, or distance between each contact. This miniaturization of the connectors presents serious problems for electrical testing of the disk drive during manufacturing. In current high volume disk drive manufacturing lines, a variety of electrical tests on the disk drives are carried out at many stations on the line. Electrical connections to the contacts on the connectors are made with spring-loaded pins (pogo pins) using automated tools. As the connectors decrease in size, the decreased contact pitch results in electrical shorts to test equipment due to pogo pin design limitations, and due to increased problems with alignment of the automated tooling to make reliable contacts to the connectors. These problems lead to decreased test reliability, decreased manufacturing yield and ultimately increased manufacturing cost. In addition, the connector is also subject to numerous tests in the manufacturing line. By the time the disk drive passes this suite of tests, there may actually be quite a bit of damage (such as indentations or scratches) to the connector which can result in problems once the disk drive is out in the field.

It therefore can be seen that there is a need for an apparatus and method for reliably making electrical connection on connectors having small pitch between contacts that is suitable for electrical testing by automated equipment in a high volume manufacturing environment. Further, there is a need for a contacting apparatus and method that can be easily adapted for use with a variety of connectors used in disk drive products without the need for costly test fixture redesign.

SUMMARY OF THE INVENTION

It is an object of the present invention to disclose a high density test connector for making electrical connections to a disk drive that provides for easy and reliable connectivity with tester probes during the disk drive manufacturing process.

It is another object of the present invention to disclose a test connector for making electrical connections to a disk drive that provides large contact pitch and large contact pad surface areas for easy and reliable connectivity to tester probes.

It is a further object of the present invention to disclose a test connector for making electrical connections to a disk drive during manufacturing testing processes that can be removed after the manufacturing process and reused many times on subsequent disk drives in a high volume manufacturing process.

It is yet another object of the present invention to disclose a test connector that can be easily adapted for use with different disk drive designs without the need to redesign the manufacturing tester probes.

Another object of the present invention is to provide a test connector that would lessen damage to product connector on the disk drives or reduce number of rework or teardown as a possible result of damage to the product connector and accordingly, the usage of the test connector preserves the integrity, reliability and quality of the disk drives.

It is a still further object of the present invention to disclose a method for using the test connector for disk drive testing in a high volume manufacturing process.

In accordance with the principles of the present invention, there is disclosed a test connector comprising a high density connector header having a plurality of contacts fixed to a relatively large area printed circuit board (PCB) card having contact pads and traces electrically connected to the contacts on the connector header. The connector header is chosen to connect with and make electrical connections to the electrical connector provided on the disk drive for interfacing with external electronics. The PCB card has a plan area much greater than the plan area of the connector header allowing sufficient area for a plurality of well-separated, large area contact pads on the upper surface of the PCB card that may be connected using traces and via connections through the PCB card to each of the closely spaced (small pitch) contacts on the connector header. The well-separated, large area contact pads on the upper surface of the PCB card provide contact points for electrical test probes from test apparatus on the assembly line during the disk drive manufacturing process.

The test connector of the present invention may be used in the following manner during disk drive assembly and testing in an automated high volume assembly line. At a suitable stage on the assembly line, prior to any electrical testing processes on the disk drive, the test connector is installed on the disk drive by attaching the connector header portion of the test connector to the disk drive electrical connector. The test connector remains attached to the disk drive electrical connector as the disk drive moves along the assembly line. At assembly line stations where electrical testing of the disk drive is carried out, electrical test probes are positioned by automated equipment to make contact to the desired contact pads on the upper surface of the PCB card of the test connector. As the disk drive proceeds along the assembly line, a plurality of different electrical tests may be performed at automated test stations by having test probes access and make electrical contact to contact pads on the PCB card of the test connector. At the end of the assembly line, the test connector may be removed by detaching it from the disk drive electrical connector. The test connector may now be reused by installing it on another disk drive on the assembly line at the beginning of the process. Use of the test connector with its well-separated, large area contact pads greatly increases the reliability of electrical testing procedures with automated testers by reducing accidental shorting between test probes and by increasing contact alignment tolerances.

On advantage of the test connector having well-spaced, large area contact pads is that it provides for reliable, high alignment tolerance electrical connection to automated testers. This feature of the test connector of the present invention greatly facilitates the process of making electrical contacts with automated tester equipment test probes to disk drives having electrical connectors with high density, closely-spaced contacts.

Another advantage of the test connector of the present invention is that the connector may be reused many times on a high volume manufacturing assembly line. Test connectors may be removed from completed disk drives at the end of the manufacturing assembly process and returned to the start of the process for connection to a disk drive at an early stage of assembly. Reusability of the test connectors provides significant cost reductions in the manufacturing process.

Yet another advantage of the test connector of the present invention is that the test connector may be easily adapted for use with disk drives having any of a variety of electrical connectors.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like of similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
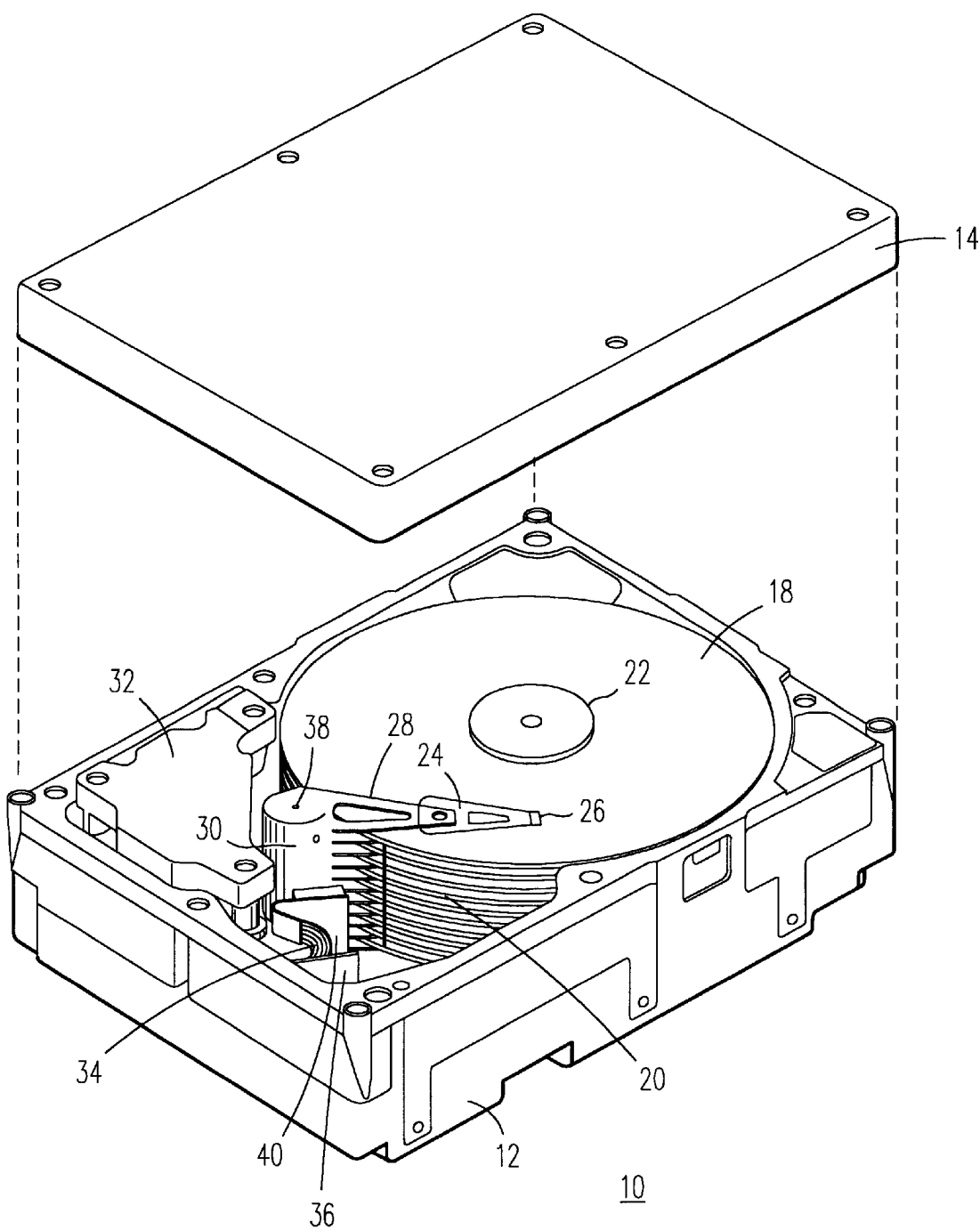
FIG. 1 is an isometric view of the disk drive of the present invention with the top cover exploded to illustrate the relative placement of the components.

FIG. 1 shows a disk drive system designated by the general reference number 10. The lid 14 of the disk drive is shown exploded. In operation, the lid would be disposed on top of the housing 12.

The disk drive comprises one or more magnetic disks 18. The disks 18 may be conventional particulate or thin film recording disks, which are capable of storing digital data in concentric tracks. In a preferred embodiment, both sides of the disks 18 are available for storage, and it will be recognized by one of ordinary skill in the art that the disk drive 10 may include any number of such disks 18.

The disks 18 are mounted to a spindle 22. The spindle 22 is attached to a spindle motor (not shown) which rotates the spindle 22 and the disks 18 to provide read/write access to the various portions of the concentric tracks on the disks 18.

An actuator assembly 30 includes a positioner arm 28, and a suspension assembly 24. The suspension assembly 24 includes a slider/transducer assembly 26 at its distal end. Although only one slider/transducer assembly 26 of the suspension assembly 24 is shown, it will be recognized that the disk drive 10 has one slider/transducer assembly 26 for each side of each disk 18 included in the drive 10. The positioner arm 28 further comprises a pivot 38 around which the positioner arm 28 pivots.

The disk drive 10 further includes an amplifier chip 40. As is well known in the art, the amplifier chip 40 cooperates with the slider/transducer assembly on the slider assembly 26 to read data from or write data to the disks 18. A flexible printed circuit member or actuator flex cable 34 carries signals between the amplifier chip 40 and a connector pin assembly (not shown) which interfaces with the external signal processing electronics. The actuator flex cable 34 leading from the amplifier chip 40 is attached to an arm electronics (AE) bracket 36 which directs the actuator flex cable 34 to a connector port for connection to the connector pin assembly.

The main function of the actuator assembly 30 is to move the positioner or actuator arm 28 around the pivot 38. Part of the actuator assembly 30 is the voice coil motor (vcm) assembly 32 which comprises a vcm bottom plate, a magnet and a vcm top plate in combination with an actuator coil. Current passing through the actuator coil interacts with the magnetic field of the magnet to rotate the positioner arm 28 and suspension assembly 24 around the pivot 38, thus positioning the transducer/suspension assembly as desired.

Figure 2:
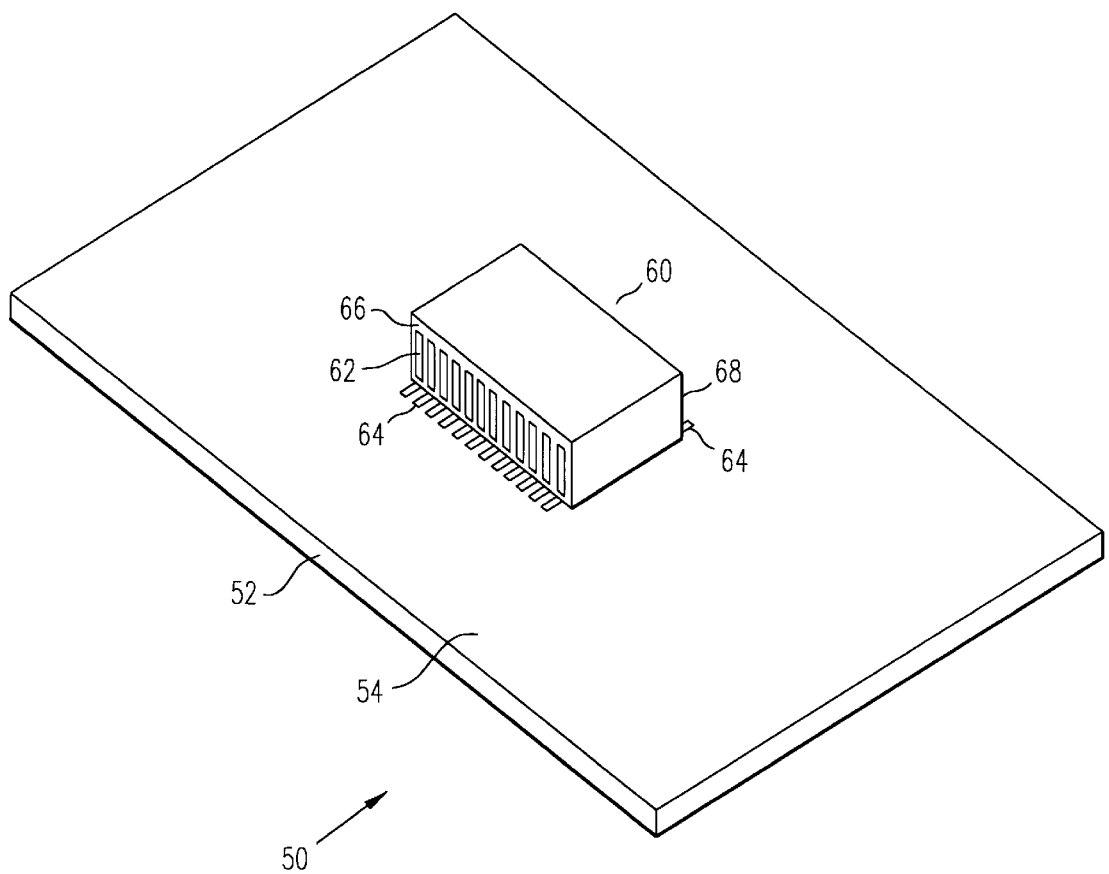
FIG. 2 is an isometric view (not to scale) of the test connector of the present invention.

FIG. 2 shows an isometric view of a test connector 50 according to the preferred embodiment of the present invention. The test connector 50 comprises a printed circuit board (PCB) card 52, having a top surface (not shown) and a bottom surface 54, and a high density connector header 60 fixed on the bottom surface 54 of the PCB card 52.

The bottom surface 54 of the PCB card 52 is the solder side of the PCB on which a solder pattern of electrical connections is formed. The top surface (not shown) of the PCB card 52 is the printed circuit side of the PCB on which a pattern of electrical connections and leads (sometimes referred to as traces) may be formed on a thin conducting surface layer (usually copper) by lithographic and etching processes known to the art. Electrical connections may be made between the connections on the solder side of the PCB and the printed circuits formed on the printed circuit side of the PCB by means of metallization through small holes or vias through the PCB as is known in the art.

In the preferred embodiment of the invention, the connector header 60 is designed to mate with a particular high density connector that is used as the electrical interface connector for the disk drive product being manufactured. These high density connectors have a plurality of closely spaced (small pitch) electrical contacts usually arranged in rows along the body of the connector. The electrical contacts may be spring contacts, or alternatively, pins or pin receptacles that can mate with and make electrical contact to a plurality of electrical contacts on the appropriate mating connector. The connector header 60 described herein and illustrated in the drawings is a simplified connector header intended to convey the essential features of the invention.

The high density connector header 60 has a substantially rectangular shaped body having a first side 66 and a second side 68. Closely spaced spring contacts 62 arranged in rows are fixed on the first and second sides 66 and 68 of the connector header 60. The spring contacts 62 are each electrically connected to a plurality of tabs 64 fixed to connector header 60 in rows protruding from the first and second sides of the connector header 60. The tabs 64 provide electrical connection of the spring contacts 62 on the connector header 60 to the solder pattern of electrical connections (not shown) on the bottom surface 54 of the PCB card 52.

Figure 3A:
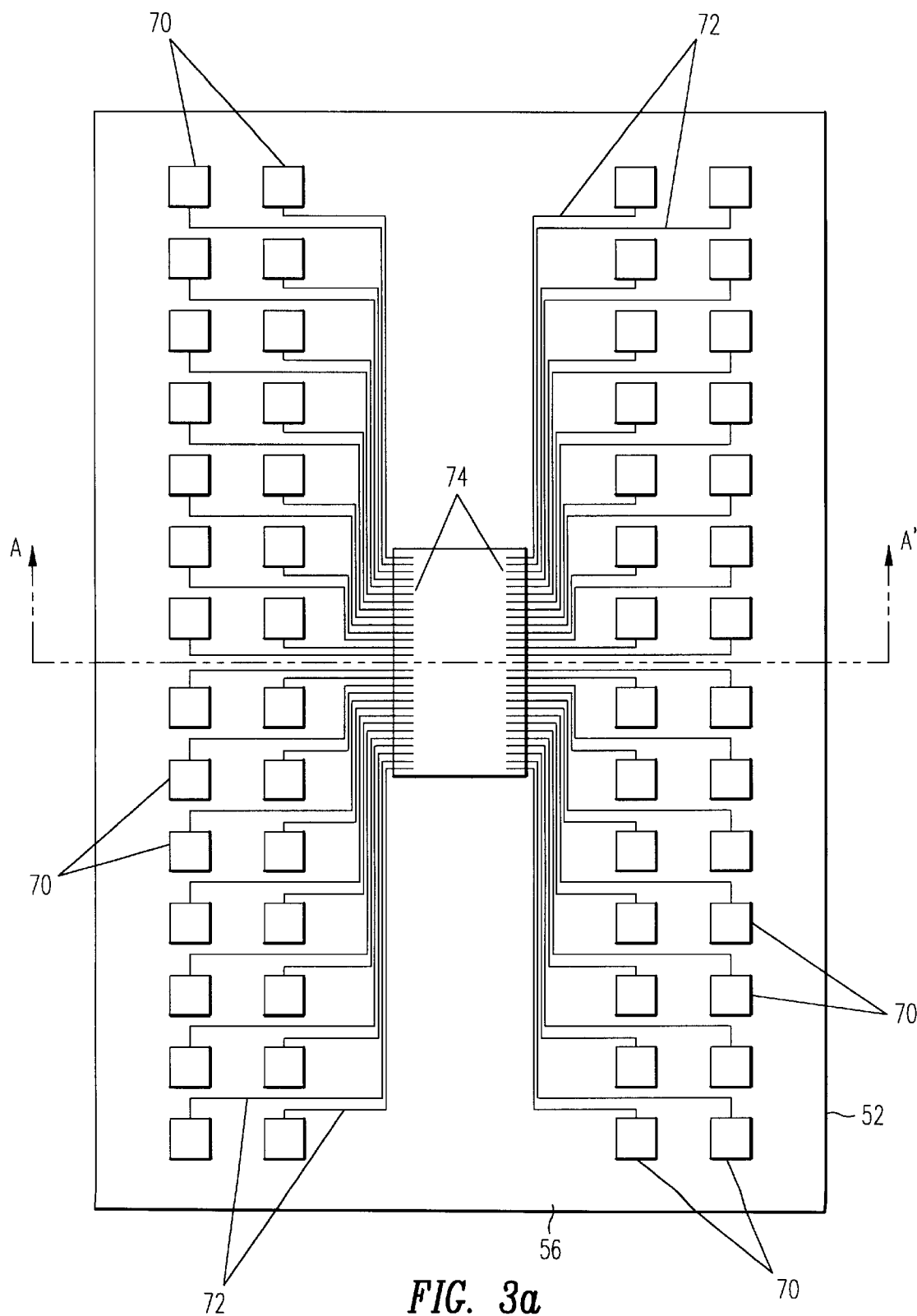
FIGS. 3a, 3b and 3c are a top view, a side view and a view of section A–A' of FIG. 3a, respectively, of an embodiment of the test connector of the present invention.
Figure 3B:
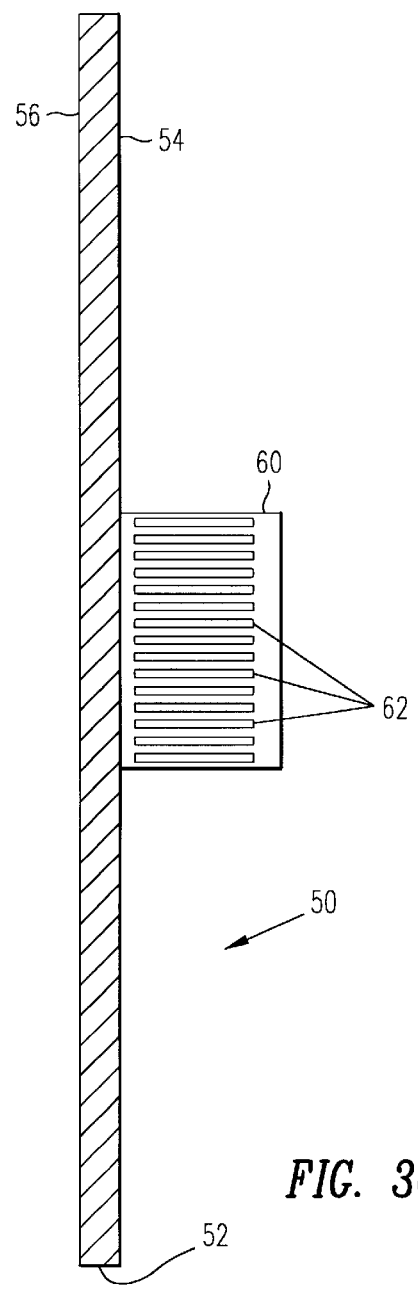
Figure 3C:
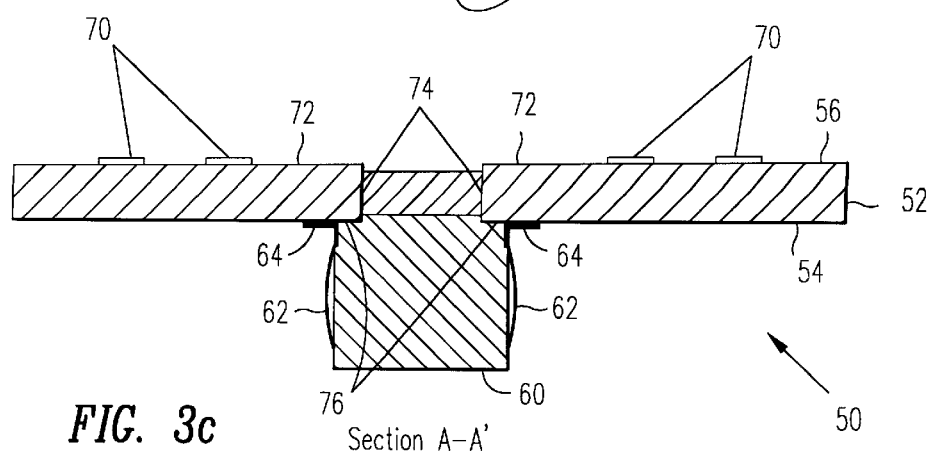

FIGS. 3a, 3b and 3c show a top view, a side view and a view of section A–A' of the test connector, respectively. FIG. 3a shows the PCB card 52 having a top surface 56 with a pattern of contact pads 70 and electrically conducting traces 72 formed on the top surface 56. The pattern of contact pads 70 and traces 72 are formed are formed of copper by photolithography and etching processes known to the art. The contact pads 70 may be plated with gold to provide good electrical contacts for test probes (for example, pogo pins). The contact pads 70 are well-spaced from each other, preferably having center-to-center separation in the range of 1–5 mm, to ensure reliable test probe connection. The traces 72 provide electrical connection paths from a plurality of contact pads 70 to a plurality of vias 74. The vias 74 are holes through the PCB card 52 that have been metallized to provide electrical connection from the pattern side on the top surface 56 to the solder side on the bottom surface 54.

Referring now to FIG. 3c showing section A–A', the conducting vias 74 provide electrical connection of the traces 72 on the top surface 56 to a plurality of solder pads 76 on the bottom surface 54. The solder pads 76 are formed in a pattern on the bottom surface 54 providing electrical connections to the tabs 64 and contacts 62 on the connector header 60. Connector header 60 is aligned relative to the PCB card 52 so that the tabs 70 may be electrically connected, usually by a soldering process, to the solder pads 76. Spring contacts 62 fixed on the connector header 60 are electrically connected to the tabs 64. It will be apparent from the above description, that there is a direct electrical connection from each one of the large area, well-spaced contact pads 70 on the PCB card 52 to one of the closely-spaced contacts 62 on the high density connector header 60.

Figure 4:
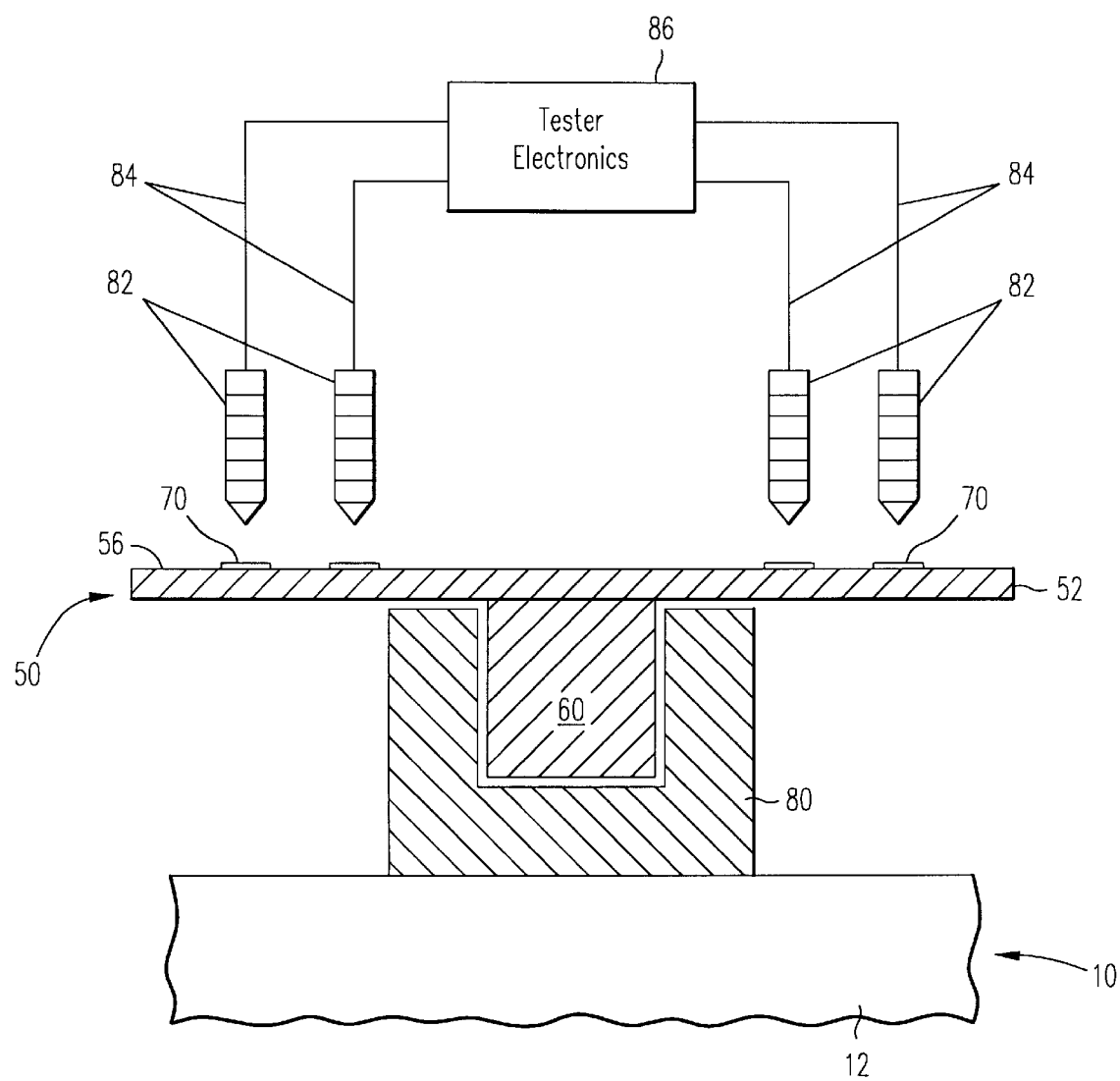
FIG. 4 is a schematic view of the test connector of the present invention connected to a disk drive connector for electrical testing of the disk drive.

FIG. 4 is a schematic view showing the test connector 50 with the connector header 60 mating with and electrically connected to a disk drive electrical connector 80 fixed on the housing 12 of the disk drive 10. The disk drive electrical connector 80 is a high density electrical connector having a plurality of contacts (not shown) to provide electrical interfacing of the disk drive 10 with external control and signal processing electronics. The test connector 50 provides a temporary electrical connection to the disk drive electrical connector 80 during the manufacturing process of the disk drive 10 on an assembly line. The test connector 50 provides well-spaced, large area contact pads 70 for making reliable connections with large alignment tolerances by test probes 82 from automated testers. At a plurality of automated test stations on the assembly line, test probes 82 are aligned with the contact pads 70 on the upper surface 56 of the test connector 50 and pressed into contact with the contact pads 70 to make electrical connection with the desired contacts of disk drive 10. Leads 84 provide electrical connections of the test probes 82 to the tester electronics 86. The novel feature of the present invention is to provide a test connector 50 for use during the manufacturing process of the disk drive 10, the test connector having well-spaced, large area contact pads for reliable, high alignment tolerance electrical connection to automated testers. This feature of the test connector of the present invention greatly facilitates the process of making electrical contacts with automated tester equipment test probes to disk drives having electrical connectors with high density, closely-spaced contacts.

Another advantage of the test connector of the present invention is that the connector may be reused many times on a high volume manufacturing assembly line. Test connectors may be removed from completed disk drives at the end of the manufacturing assembly process and returned to the start of the process for connection to a disk drive at an early stage of assembly. Reusability of the test connectors provides significant cost reductions in the manufacturing process.

Yet another advantage of the test connector 50 of the present invention is that the test connector may be easily adapted for use with disk drives having any of a variety of electrical connectors. By choosing or designing a connector header 60 that mates with the particular disk drive electrical connector 80 used on the disk drive, a test connector can be easily provided that is compatible with the automated testers on the manufacturing line since the dimensions and spacing of the contact pads on the PCB card 52 can be left unchanged. This adaptability of the test connector design can lead to significant manufacturing cost savings since it eliminates or greatly reduces the need to modify automated testers and their test probes and test probe alignment tooling.

Lastly, while the present invention has been described in connection with its use in the disk drive industry, the present connector need not be limited as such. The usage of the connector could be extended to high-density chip probe tests in semiconductor industry, RF/microwave PCB tests, network interface card tests in communications and networking industry, and other electronic test industries.

While the preferred embodiment of the present invention has been illustrated herein in detail, it will be apparent that modifications and adaptations to this embodiment may occur to those skilled in the art without departing from the spirit, scope and teachings of the present invention as set forth in the following claims.

Accordingly, it is to be understood that the invention disclosed herein is not to be limited by the illustrated embodiment, but only by the scope of the appended claims.

I claim:

1. A test connector for a disk file, comprising:
    a printed circuit board (PCB) card having a top surface and a bottom surface, said PCB card having a plurality of contact pads on the top surface electrically connected by a plurality of traces to a plurality of electrically conducting vias connecting said top surface to said bottom surface; and
        a connector header for connecting the test connector to a disk file electrical connector, said connector header fixed to the bottom surface of the PCB card, and said connector header having a plurality of contacts electrically connected to the vias at the bottom surface of the PCB card for providing electrical connection of the contacts on the connector header to the contact pads on the top surface of the PCB card, the contacts of the header having a smaller pitch than the contact pads on the PCB card, the contacts of the header being exposed for connection to the disk file electrical connector.

2. The test connector as recited in claim 1, wherein the contact pads on the top surface of the PCB board are separated from one another by a spacing in the range of 1–5 mm.

3. The test connector as recited in claim 1, wherein the contact pads and the traces are made of copper.

4. The test connector as recited in claim 1, wherein the contact pads are made of gold.

5. The test connector as recited in claim 1, wherein the contacts on the connector header are chosen from a group of connectors including spring contact connectors, male pin connectors, and female pin receptacle connectors.

6. A method of using a test connector for multiple electrical testing of disk files by automated testers, comprising the steps of:
    providing a disk file;
    electrically connecting the test connector to a disk file electrical connector;
    positioning the disk file at a first automated tester;
    contacting a plurality of contact pads on the test connector with a plurality of test probes electrically connected to the automated tester;
    conducting an electrical test process on the disk file by the automated tester;
    removing the test probes from contact with the contact pads on the test connector;
    moving the disk file to a second automated tester;
    repeating the test process with an automated tester; and
    removing the test connector from the disk file electrical connector after completion of the electrical tests on the disk file.

* * * * *